United States Patent [19]
Fujikawa

[11] Patent Number: 5,631,582
[45] Date of Patent: May 20, 1997

[54] FREQUENCY AND PHASE COMPARATOR

[75] Inventor: Akio Fujikawa, Kyoto, Japan

[73] Assignee: Rohm Co., Ltd., Kyoto, Japan

[21] Appl. No.: 508,884

[22] Filed: Jul. 28, 1995

[30] Foreign Application Priority Data

Jul. 28, 1994 [JP] Japan ............... 6-176316
Jul. 28, 1994 [JP] Japan ............... 6-176470

[51] Int. Cl.$^6$ .............. H03D 13/00; G01R 25/00
[52] U.S. Cl. .............. 327/12; 327/44; 327/49; 327/161
[58] Field of Search .............. 327/2, 3, 5, 7, 327/12, 39, 40, 41, 42, 43, 44, 47, 49, 107, 147, 149, 150, 218, 161

[56] References Cited

U.S. PATENT DOCUMENTS

| | | | |
|---|---|---|---|
| 4,378,509 | 5/1983 | Hatchett et al. | 327/5 |
| 4,484,142 | 11/1984 | Rub et al. | 327/2 |
| 4,894,565 | 1/1990 | Marquardt | 327/3 |
| 4,904,948 | 2/1990 | Asami | 327/3 |
| 4,970,475 | 11/1990 | Gillig | 327/3 |
| 5,095,287 | 3/1992 | Irwin et al. | 327/3 |
| 5,142,555 | 8/1992 | Whiteside | 327/2 |
| 5,266,851 | 11/1993 | Nukui | 327/3 |
| 5,302,916 | 4/1994 | Pritchett | 327/49 |

*Primary Examiner*—Timothy P. Callahan
*Assistant Examiner*—My-Trang Nu Ton
*Attorney, Agent, or Firm*—Nikaido, Marmelstein, Murray & Oram LLP

[57] ABSTRACT

A frequency and phase comparator has a first flip-flop and a second flip-flop. Logical calculation between the outputs of these flip-flops is performed by an AND circuit, and the first and second flip-flops are reset by the output of the logical calculation. The first and second flip-flops receive periodic signals at their clock terminals. When the periods of the output pulses of the first and second flip-flops are short, a circuit driven by the pulses sometimes cannot operate correctly. To prevent this, a pulse generating circuit is provided which receives a first periodic signal and a second periodic signal to generate a pulse signal of a predetermined width, and the pulse signal is added to the outputs of the first and second flip-flops.

5 Claims, 6 Drawing Sheets

FREQUENCY AND PHASE COMPARATOR

BACKGROUND OF THE INVENTION

1. Field of the Invention

The present invention relates to a frequency and phase comparator suitable for use in a phase locked loop circuit and a motor phase controlling circuit.

2. Description of the Prior Art

In recent years, with the advent of digital audio such as satellite broadcast, digital-to-analog converters which process sound signals sampled at different sampling frequencies flood the market. For example, the transfer rate of digital sound of the satellite broadcast is approximately 0.8 megabits per second in A mode stereo and approximately 1.5 megabits per second in B mode stereo. To cope with these different transfer rates, it is necessary to provide a phase locked loop (PLL) circuit which follows the transfer rate of the digital sound signal transmitted to the apparatus. For such a PLL circuit, a phase comparator having only a phase comparing function cannot be used since the pull-in range (locking ability) is small, so that a frequency and phase comparator having a frequency comparing function as well is indispensable.

Conventionally, a circuit as shown in FIG. 1 is generally used as the frequency and phase comparator. In the figure, reference numerals 20 and 21 represent flip-flops, reference numeral 22 represents an inverter, reference numeral 23 represents an AND circuit, reference numeral 26 represents a P-type metal oxide semiconductor field effect transistor (MOSFET), and reference numeral 27 is an N-type MOSFET. Reference numeral 28 represents a power terminal connected to a power source $V_{DD}$.

An operation of the conventional frequency and phase comparator thus arranged will be described. The D flip-flop 20 has its one input D terminal pulled up by a supply voltage $V_{DD}$ through a terminal 28a. To its clock terminal C, a signal $F_{REF}$ is input. The output from a Q terminal of the flip-flop 20 is input to the inverter 22 through a node A and coupled to one input terminal of the AND terminal 23. The output of the inverter 22 is input to a gate of the P-type MOSFET.

The flip-flop 21 also has its one input D terminal pulled up by the supply voltage $V_{DD}$ through the terminal 28b, and to its clock terminal C, a signal $F_{VCO}$ is input. The output from a Q terminal of the flip-flop 21 is coupled to the other input terminal of the AND circuit 23 through a node B and input to a gate of the N-type MOSFET 27. The output of the AND circuit 23 is connected to reset input terminals of the flip-flops 20 and 21. When the voltage level of the nodes A and B are both high, the level of the output of the AND circuit 23 is high, so that the flip-flops 20 and 21 are reset.

Referring to FIG. 2, there are shown signal waveforms of elements of the circuit of FIG. 1. $F_{REF}$ is the waveform of the input of the flip-flop 20. $F_{VCO}$ is the waveform of the input of the flip-flop 21. The three waveforms A, B and O therebelow are the waveforms generated at the nodes A, B and O, respectively. In this figure, a period $t_1$ shows a case where the phase of the waveform $F_{VCO}$ is delayed from that of the waveform $F_{REF}$, a period $t_2$ shows a case where their phases coincide with each other, and a period $t_3$ shows a case where the phase of the waveform $F_{VCO}$ precedes that of the waveform $F_{REF}$.

The outputs from the Q terminals of the flip-flops 20 and 21 are used to control the MOSFETs 26 and 27. As the output of the frequency and phase comparator which appears at the node 0, the output of the supply voltage $V_{DD}$ appears when only the MOSFET 26 is ON, i.e. during the period $t_1$, and the output of the ground voltage appears when only the MOSFET 27 is ON, i.e. during the period $t_3$. When the MOSFETs 26 and 27 are both OFF, i.e. during the period $t_2$ and when there is no input to any of the flip-flops 20 and 21, the output of the frequency and phase comparator is always in a high impedance state.

In the above-described conventional arrangement, however, since the output pulse widths at the nodes A and B are small when the phase difference between the waveforms $F_{REF}$ and $F_{VCO}$ is very small, the output pulse may disappear according to the frequency characteristics of the MOSFETs 26 and 27, so that a dead band (a range between M and F) as shown in FIG. 3 is formed in the input-output characteristics.

When such a frequency and phase comparator is used, for example, in a PLL circuit, the PPL circuit not only cannot precisely follow the input frequency but also behaves as if it oscillated in the dead band.

SUMMARY OF THE INVENTION

An object of the present invention is to provide a frequency and phase comparator where substantially no dead band is formed in the input-output characteristics.

A frequency and phase comparator of the present invention is provided with the following: a first flip-flop having a reset terminal and receiving a first periodic signal at its clock terminal; a second flip-flop having a reset terminal and receiving a second periodic signal at its clock terminal; a logical circuit performing a logical calculation between an output of the first flip-flop and an output of the second flip-flop and resetting the first and second flip-flops with an output of the logical calculation; pulse generating means for receiving the first and second periodic signals to output a pulse signal of a predetermined width when logical values of the first and second periodic signals become the same; pulse adding means for adding the pulse signal to each of the outputs of the first and second flip-flops; and outputting means for synthesizing the outputs of the first and second flip-flops and outputting a synthesized signal.

According to such features, the pulse generated by the pulse generating means is added to each of the outputs of the first and second flip-flops to generate a pulse of a sufficient width, so that a MOSFET constituting the output means is caused to surely respond.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
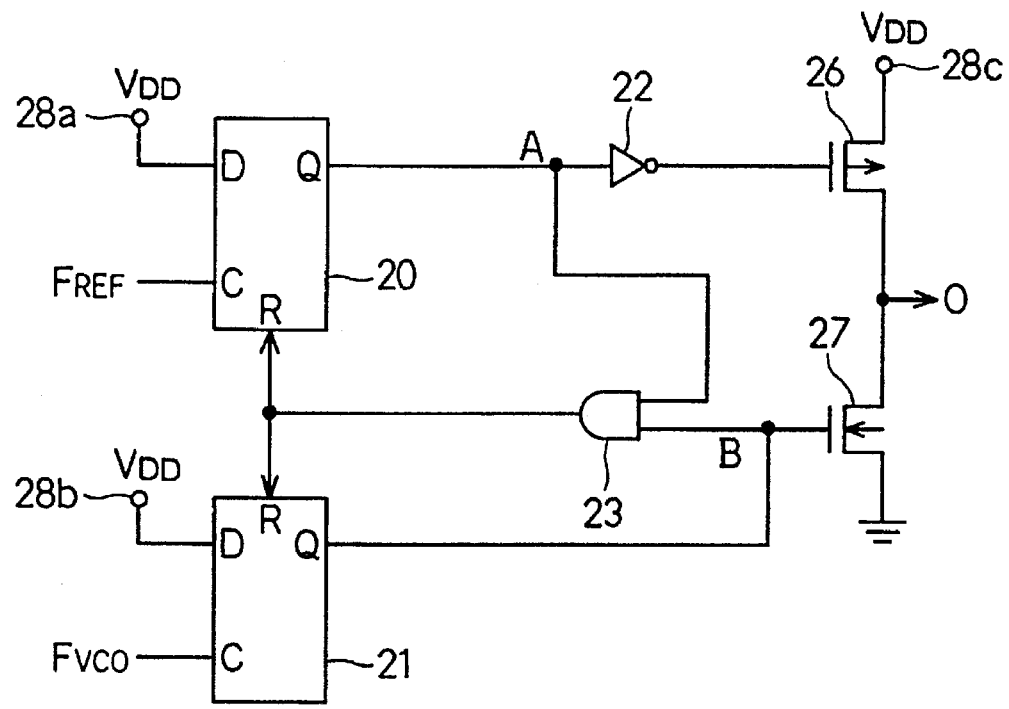
FIG. 1 is a circuit diagram of a conventional frequency and phase comparator.
Figure 2:
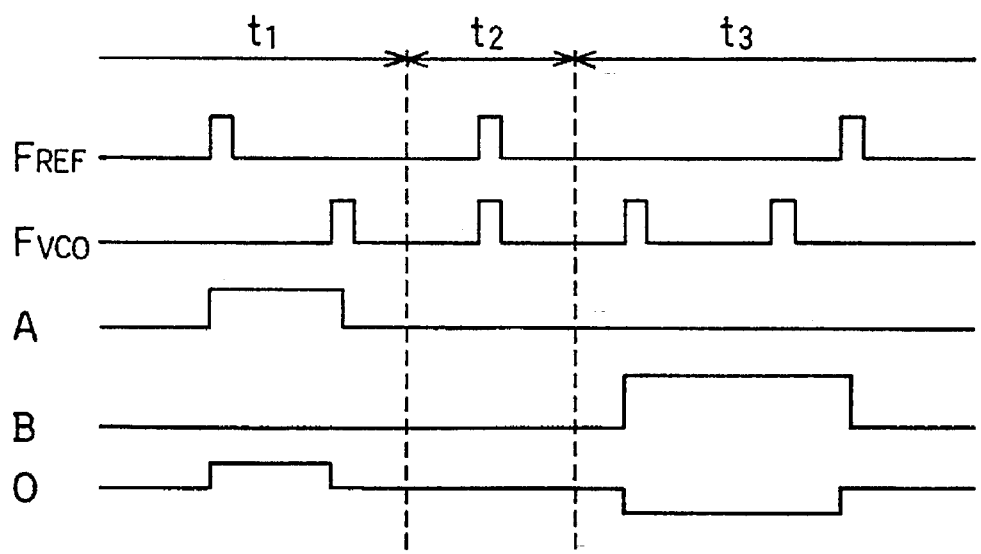
FIG. 2 shows signal waveforms of relevant portions of the conventional frequency and phase comparator.
Figure 3:
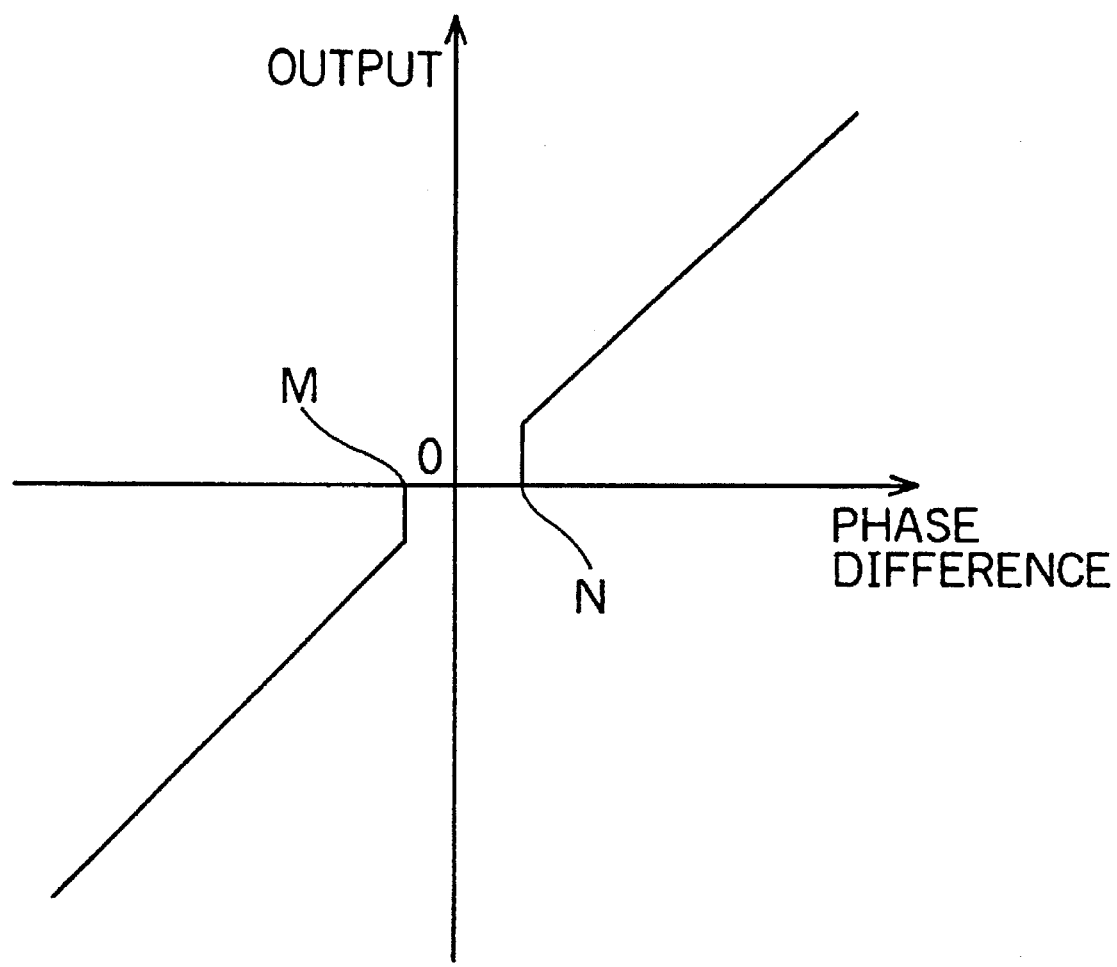
FIG. 3 shows input-output characteristics of the conventional frequency and phase comparator.
Figure 4:
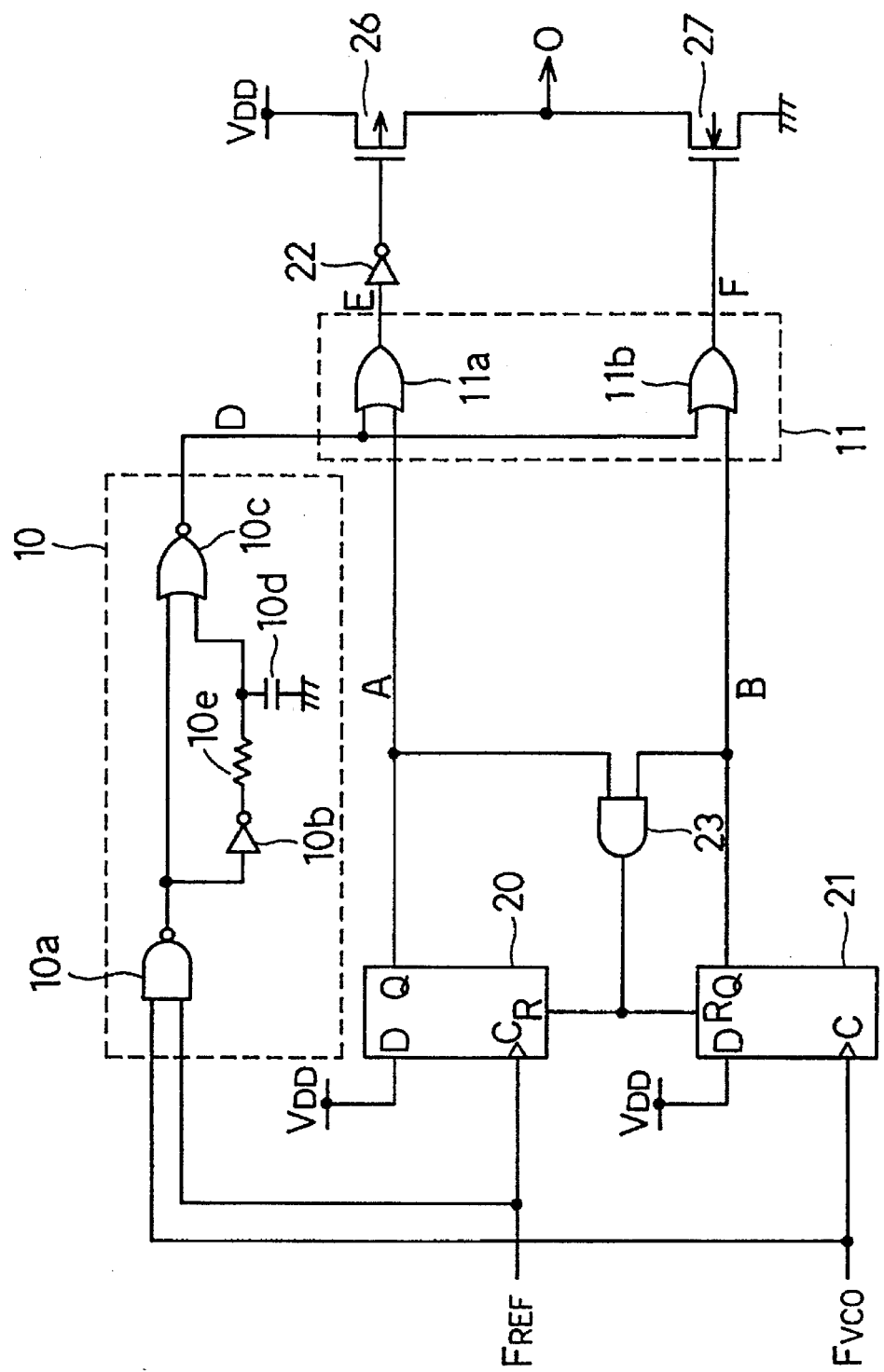
FIG. 4 is a circuit diagram of a frequency and phase comparator in a first embodiment of the present invention.

Hereinafter, embodiments of the present invention will be described with reference to the drawings. Referring to FIG. 4, there is shown a circuit diagram of a frequency and phase comparator in a first embodiment of the present invention. The flip-flops 20 and 21, the inverter 22, the AND circuit 23 and the MOSFETs 26 and 27 will not be described in detail since they are the same as those of the above-described conventional comparator. Reference numeral 10 represents a pulse generating circuit including a NAND circuit 10a, an inverter 10b, a NOR circuit 10c, a capacitor 10d and a resistor 10e. Reference numeral 11 represents a pulse adding circuit which adds a pulse generated at the pulse generating circuit 10 to outputs of the flip-flops 20 and 21. The pulse adding circuit 11 includes OR circuits 11a and 11b. To the OR circuit 11a, an output of the flip-flop 20 and an output of the pulse generating circuit 10 are input. To the OR circuits 11b, an output of the flip-flop 21 and an output of the pulse generating circuit 10 are input.

Figure 5:
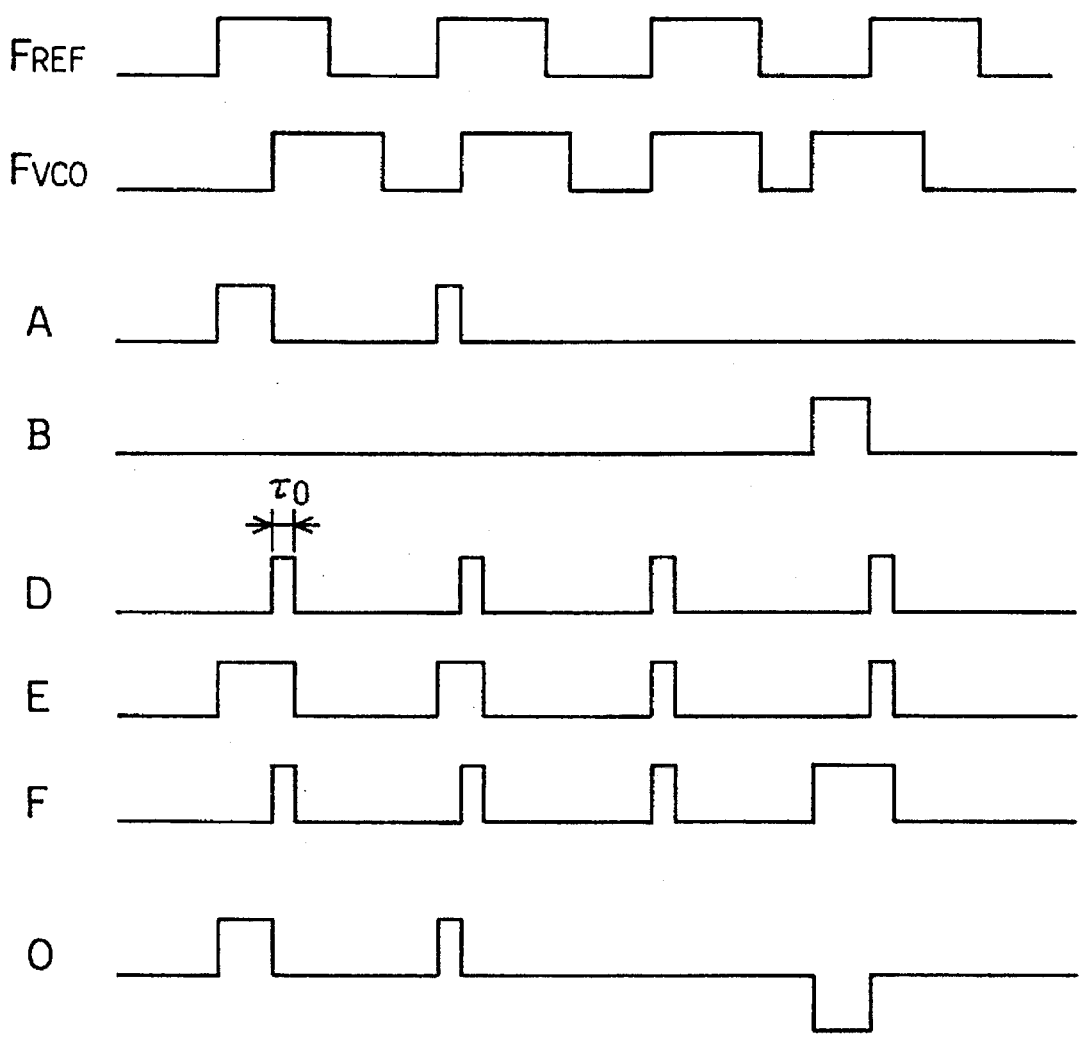
FIG. 5 shows signal waveforms of relevant portions of the frequency and phase comparator in the first embodiment.

An operation of this embodiment thus arranged will be described with reference to the signal waveform chart of FIG. 5. The signals $F_{REF}$ and $F_{VCO}$ are input to the NAND circuit 10a. The output of the NAND circuit 10a is transmitted to one input terminal of the NOR circuit 10c and to the inverter 10b. The output of the inverter 10b is delayed by a time constant $\tau_0$ constituted by the resistor 10e and the capacitor 10d and transmitted to the other input terminal of the NOR circuit 10c.

Consequently, the instant the voltage levels of the reference signal $F_{REF}$ and the target signal $F_{VCO}$ both become high, a pulse signal D of a pulse width $\tau_0$ is generated at the output of the pulse generating circuit 10. The pulse signal D is input to one of the input terminals of each of the OR circuits 11a and 11b. To the other input terminals of the OR circuits 11a and 11b, the nodes A and B are connected, respectively. In the outputs E and F of the OR circuits 11a and 11b, the pulse signal D of a time width $\tau_0$ is added to pulses generated at the nodes A and B. Consequently, a signal of a pulse width which causes the MOSFETs 26 and 27 to surely operate no matter how small the phase difference is can be supplied to the MOSFETs 26 and 27.

As described above, according to this embodiment, since a pulse which causes the MOSFETs 26 and 27 constituting the output stage to surely operate is supplied, no dead band is formed in the input-output characteristics. That is, by generating pulses by the pulse generating circuit 10 to add the pulses to the outputs of the first and second flip-flops 20 and 21, the MOSFET can surely be operated.

Figure 6:
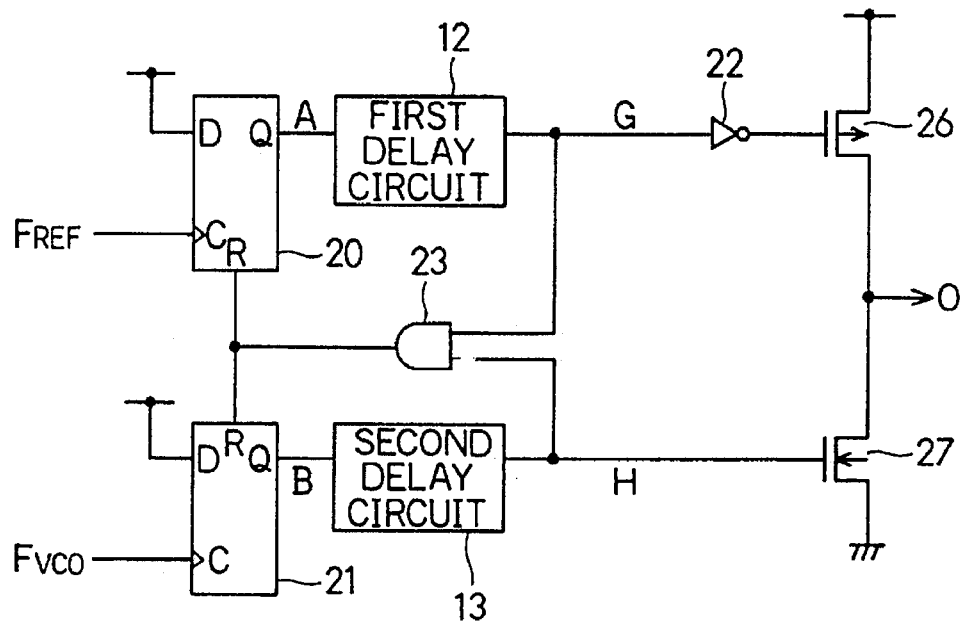
FIG. 6 is a circuit diagram of a frequency and phase comparator in a second embodiment of the present invention.

Referring to FIG. 6, there is shown a circuit diagram of a frequency and phase comparator in a second embodiment of the present invention. The flip-flops 20 and 21, the inverter 22, the AND circuit 23 and the MOSFETs 26 and 27 will not be described in detail since they are the same as those of the conventional comparator. Reference numeral 12 represents a first delay circuit. Reference numeral 13 represents a second delay circuit.

Figure 7:
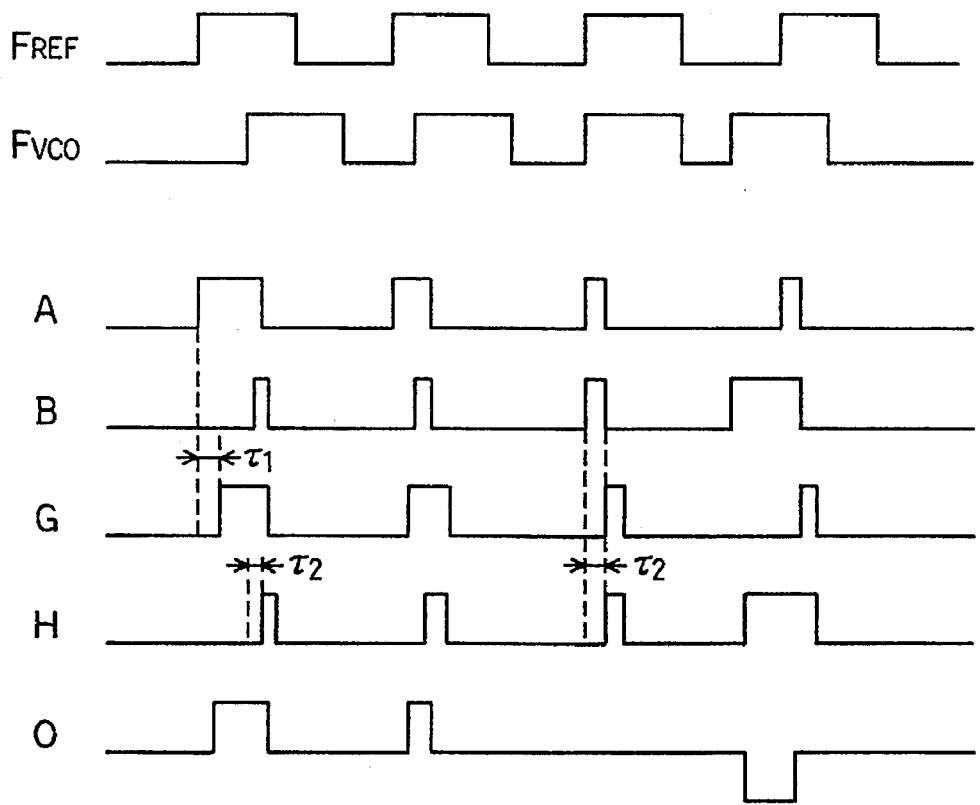
FIG. 7 shows signal waveforms of relevant portions of the frequency and phase comparator in the second embodiment.

An operation of the second embodiment thus arranged will be described with reference to the signal waveform chart of FIG. 7. The first delay circuit 12 delays the output of the flip-flop 20 by a time $\tau_1$. The second delay circuit 13 delays the output of the flip-flop 21 by a time $\tau_2$. They are delayed by the different times in order to correct the time required for transmitting the outputs of the flip-flops 20 and 21 to the MOSFETs 26 and 27 which time differs according to the position on the mask used in manufacture. Therefore, the output from the first and second delay circuits 12 and 13 are delayed substantially to output at the same time $\tau_3$.

Consequently, the result of an AND calculation by the AND circuit 23 is delayed by the time $\tau_3$, so that the reset timings of the flip-flops 20 and 21 are delayed by the time $\tau_3$. As a result, the widths of the pulses outputted from the flip-flops 20 and 21 are extended by the time $\tau_3$. Thus, by providing the first and second delay circuits 12 and 13, advantages are obtained which are substantially similar to those of the first embodiment where the pulse generating circuit 10 and the pulse adding circuit 11 are provided.

Further, according to the second embodiment, when the comparator is realized in the form of an integrated circuit, the deviation of the delay time due to the position difference on the mask can be corrected, so that the performance to remove the dead band is further improved.

While the reset terminals of the flip-flops 20 and 21 are activated at a high voltage in the above-described embodiments, they may be activated at a low voltage and the AND circuit may be replaced by a NAND circuit. The first and second delay circuits 12 and 13 of the second embodiment may be realized by using the gate delay or by providing capacity loads to the output impedances of the flip-flops 20 and 21.

Figure 8:
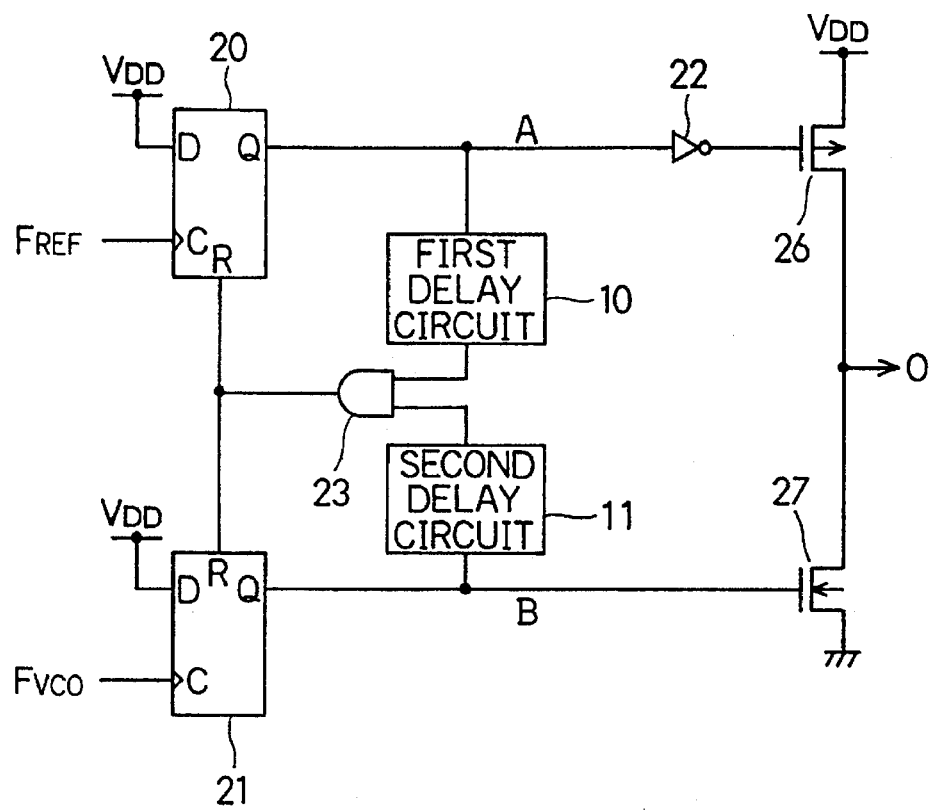
FIG. 8 is a circuit diagram of a frequency and phase comparator in a third embodiment of the present invention.

Subsequently, a third embodiment of the present invention will be described with reference to FIG. 8. The flip-flops 20 and 21, the inverter 22, the AND circuit 23 and the MOSFETs 26 and 27 will not be described in detail since they are the same as those of the above-described conventional comparator. Reference numeral 10 represents a first delay circuit. Reference numeral 11 represents a second delay circuit.

Figure 9:
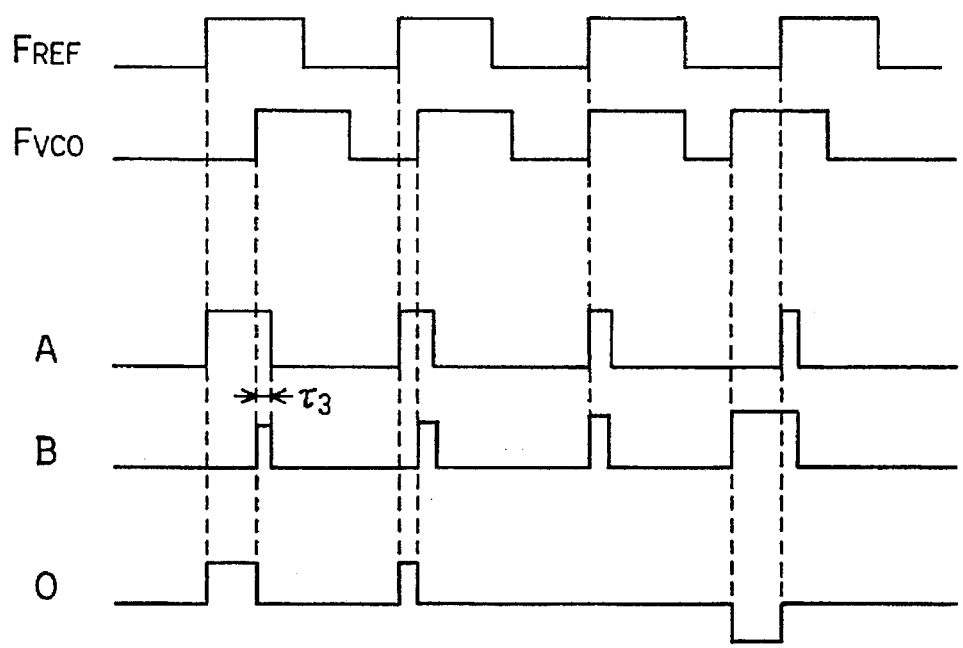
FIG. 9 shows signal waveforms of relevant portions of the frequency and phase comparator in the third embodiment.

An operation of the third embodiment will be described with reference to the signal waveform chart of FIG. 9. The first delay circuit 10 delays the Q output of the flip-flop 20 by a time $\tau_1$. The second delay circuit 11 delays the Q output of the flip-flop 21 by a time $\tau_2$. They are delayed by the different times in order to correct the time required for transmitting the outputs of the flip-flops 20 and 21 to the MOSFETs 26 and 27 which time differs according to the position on the mask. Therefore, the output from the first and second delay circuits 10 and 11 are delayed substantially to output at the same time $\tau_3$.

Consequently, the result of an AND calculation by the AND circuit 23 is delayed by the time $\tau_3$, so that the reset timings of the flip-flops 20 and 21 are delayed by the time $\tau_3$. As a result, the widths of the pulses output from the flip-flops 20 and 21 are extended by the time $\tau_3$. Thus, the MOSFETs 26 and 27 are caused to surely respond. Further, since there is no time lag in the phase comparison result although the first and second delay circuits 10 and 11 are provided, the stability of the PLL circuit is not broken.

Thus, since the first and second delay circuits 10 and 11 are provided at the outputs of the first and second flip-flops 20 and 21, respectively, the propagation of the pulses supplied to the reset terminals R of the first and second flip-flops 20 and 21 is delayed to increase the widths of the pulses outputted by the first and second flip-flops 20 and 21, so that a pulse is supplied which causes the MOSFETs 26 and 27 to surely respond. As a result, no dead band is formed in the input-output characteristics.

In addition, when the comparator is realized in the form of an integrated circuit, the deviation of the delay time due to the position difference on the mask can be corrected, so that the performance to remove the dead band is further improved. Further, since there is no time lag in the phase comparison result although the first and second delay circuits 10 and 11 are provided, the operation of the PLL can be performed quickly compared to the second embodiment of FIG. 6.

When the frequency and phase comparator of the present invention is used, for example, in a PLL circuit, the PLL circuit precisely follows the input frequency, and since there is no dead band in the input-output characteristics. As a result, a stabler PLL is formed.

Obviously, many modifications and variations of the present invention are possible in light of the above teachings. It is therefore to be understood that within the scope of the appended claims, the invention may be practiced other than as specifically described.

What is claimed is:

1. A frequency and phase comparator comprising:

a first flip-flop having a reset terminal and receiving a first periodic signal at its clock terminal;

a second flip-flop having a reset terminal and receiving a second periodic signal at its clock terminal;

a logical circuit performing a logic calculation between an output of the first flip-flop and an output of the second flip-flop, said logical circuit resetting the first and second flip-flops with an output of the logical calculation;

pulse generating means, having an input connected to only inputs of said first and second flip-flops, for receiving only the first and second periodic signals to output a pulse signal of a predetermined width when logical values of the first and second periodic signals become the same;

pulse adding means for adding the pulse signal to each of the outputs of the first and second flip-flops; and outputting means for combining the pulse-signal-added outputs of the first and second flip-flops and outputting a combined signal.

2. A frequency and phase comparator according to claim 1, wherein said pulse generating means comprises a NAND circuit to which the first and second periodic signals are input, an inverter for inverting an output of the NAND circuit, an integrator circuit for integrating an output of the inverter, and a NOR circuit to which outputs of the NAND circuit and the integrator circuit are input and from which the pulse signal is output.

3. A frequency and phase comparator according to claim 1, wherein said outputting means comprises a p-channel MOS transistor and an n-channel MOS transistor that are connected between a power voltage and a ground, and an inverter connected to one of gates of each of the MOS transistors, wherein an output of the pulse adding means is fed through said inverter to one of the MOS transistors and directly to the other of the MOS transistors so that the combined signal is output from a node between the MOS transistors.

4. A frequency and phase comparator comprising:

a first flip-flop having a reset terminal and receiving a first periodic signal at its clock terminal;

first delaying means for delaying an output of the first flip-flop by a predetermined time $\tau_1$;

a second flip-flop having a reset terminal and receiving a second periodic signal at its clock terminal;

a second delaying means for delaying an output of the second flip-flop by a predetermined time $\tau_2$;

a logical circuit performing a logical calculation between an output of the first delaying means and an output of the second delaying means, said logical circuit resetting the first and second flip-flops with an output of the logical calculation; and outputting means for combining the outputs of the first and second delaying means, wherein said predetermined time $\tau_1$ and said predetermined time $\tau_2$ are so different from each other that a time required for transmitting the output of the first flip-flop to the outputting means is substantially equal to a time required for transmitting the output of the second flip-flop to the outputting means.

5. A frequency and phase comparator comprising:

a first flip-flop having a reset terminal and receiving a first periodic signal at its clock terminal;

first delaying means for delaying an output of the first flip-flop by a predetermined time $\tau_1$;

a second flip-flop having a reset terminal and receiving a second periodic signal at its clock terminal;

a second delaying means for delaying an output of the second flip-flop by a predetermined time $\tau_2$;

a logical circuit which performs a logical calculation between an output of the first delaying means and an output of the second delaying means, said logical circuit resetting the first and second flip-flops with an output of the logical calculation; and outputting means for combining the outputs of the first and second flip-flops, wherein said predetermined time $\tau_1$ and said predetermined time $\tau_2$ are so different from each other that a time required for transmitting the output of the first flip-flop to the outputting means is substantially equal to a time required for transmitting the output of the second flip-flop to the outputting means.

* * * * *